United States Patent
Goetschalckx

(10) Patent No.: US 6,713,878 B2
(45) Date of Patent: Mar. 30, 2004

(54) ELECTRONIC ELEMENT WITH A SHIELDING

(75) Inventor: Paul August Jozef Karel Louis Goetschalckx, St. Katelijne-Waver (BE)

(73) Assignee: STMicroelectronics, Rousset Cedex (FR)

( * ) Notice: Subject to any disclaimer, the term of this patent is extended or adjusted under 35 U.S.C. 154(b) by 0 days.

(21) Appl. No.: 10/154,815

(22) Filed: May 28, 2002

(65) Prior Publication Data

US 2002/0189834 A1 Dec. 19, 2002

(30) Foreign Application Priority Data

May 30, 2001 (EP) ............................................. 01401665

(51) Int. Cl.⁷ .............................................. H01L 23/48
(52) U.S. Cl. ....................................................... 257/778
(58) Field of Search ................................ 174/260, 261, 174/35 R, 51, 52.4, 52.1; 361/760, 783, 799, 808; 257/778, 704, 738

(56) References Cited

U.S. PATENT DOCUMENTS

| | | | |
|---|---|---|---|
| 5,311,059 A | | 5/1994 | Banerji et al. |
| 5,371,404 A | * | 12/1994 | Juskey et al. ............... 257/659 |
| 5,694,300 A | * | 12/1997 | Mattei et al. ............... 361/818 |
| 5,737,191 A | * | 4/1998 | Horiuchi et al. ............ 361/764 |
| 5,866,943 A | * | 2/1999 | Mertol ....................... 257/712 |
| 5,907,477 A | * | 5/1999 | Tuttle et al. ................ 361/760 |
| 6,075,289 A | | 6/2000 | Distefano |
| 6,092,281 A | | 7/2000 | Glenn |
| 6,144,101 A | | 11/2000 | Akram |
| 6,191,360 B1 | * | 2/2001 | Tao et al. .................. 174/52.4 |
| 6,400,032 B1 | * | 6/2002 | Akram ....................... 257/778 |

FOREIGN PATENT DOCUMENTS

| | | | |
|---|---|---|---|
| JP | 61150250 | | 7/1986 |
| JP | 02-94535 A | | 4/1990 |
| JP | 2-239627 | | 9/1990 |
| JP | 11040709 A | * | 2/1999 |
| JP | 02000031207 A | * | 1/2000 |
| SE | WO2001152251 | * | 3/2001 |
| TW | 413913 A | * | 6/1999 |
| WO | WO 00/19531 A1 | | 4/2000 |

* cited by examiner

Primary Examiner—Evan Pert
Assistant Examiner—J B Patel
(74) Attorney, Agent, or Firm—Sughrue Mion, PLLC

(57) ABSTRACT

An electronic element having a carrier with an electrically conductive plane. A flipped chip die is mounted on the carrier, the flipped chip die having a backside opposite to a front side directed towards the carrier. The electronic element also has an electromagnetic interference shield with an electrically conductive means that electrically connects an electrically conductive layer of the backside of the flipped chip die to the conductive plane of the carrier.

10 Claims, 2 Drawing Sheets

ELECTRONIC ELEMENT WITH A SHIELDING

The invention relates to an electronic element comprising:
- a carrier having an electrically conductive mass plane;
- a flipped chip die mounted on said carrier, said flipped chip die having a backside opposite to a front side directed towards the carrier; and
- an electromagnetic interference shield electrically connected to the mass plane of the carrier.

SUMMARY OF THE INVENTION

Electromagnetic interference (EMI) problems are well known. EMI is a particular problem in cellular phones in which an antenna emits radio frequencies (RF) which could affect the other circuitry operating in the phone.

For solving this problem, it has been proposed to use EMI shielding.

U.S. Pat. No. 6,092,281, the content of which is incorporated in the present specification by reference, teaches such an EMI shielding.

In the shielding of U.S. Pat. No. 6,092,281, the carrier is provided with electrically conductive dams forming a chamber or pocket, the bottom of which is a portion of the carrier. In said chamber, the flipped chip is placed. The chamber or pocket is closed with an electrically conductive cover distant from the flipped chip. The free space between the flip chip and the dams and cover is filled with an electrically insulating encapsulating material.

The production of such shielding is expensive, as it requires separate shielding cover, formation of dams, soldering operation, filling operation with insulating encapsulating material, etc.

The invention seeks to provide an electronic element, which provides shielding without requiring the use of dams or a cover to be soldered to dams.

In accordance with the invention, this object is accomplished in an element of the type disclosed in the first paragraph of the present specification, in that the electromagnetic interference shield comprises an electrically conductive means electrically connecting an electrically conductive layer on the backside of the flipped chip die, preferably covering the whole backside of the flipped chip die, to the mass plane of the carrier.

Advantageously, the conductive means electrically connects the conductive layer on the backside of the flipped chip die to the mass plane of the carrier, so as to make a faraday cage around the die.

Preferably, the electrically conductive means electrically connecting the conductive layer on the backside of the flipped chip die to the mass plane of the carrier comprises conductive glue and/or a conductive tape.

According to another embodiment, the electrically conductive connection means, connecting the conductive layer on the backside of the flipped chip die to the mass plane of the carrier, comprises a conductive connection through the die, connecting the conductive layer to bond pads on the front side of the die that is connected to the carrier.

The invention further relates to an apparatus comprising an electronic circuit comprising at least an element of the invention.

Preferably, it comprises at least an antenna for emitting a radio frequency. The apparatus of the invention is for example an apparatus for GSM and DECT applications.

BRIEF DESCRIPTION OF THE DRAWINGS

Details and characteristics of the invention will appear from the following description in which reference is made to the attached drawings, wherein.

DETAILED DESCRIPTION OF THE INVENTION

Figure 1:
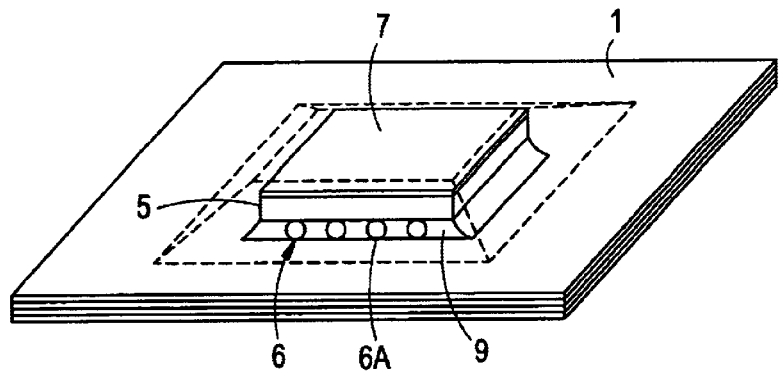
FIG. 1 is a partial perspective view of an electronic element of the invention, partially cut away and with a covering mold component in interrupted line.
Figure 2A:
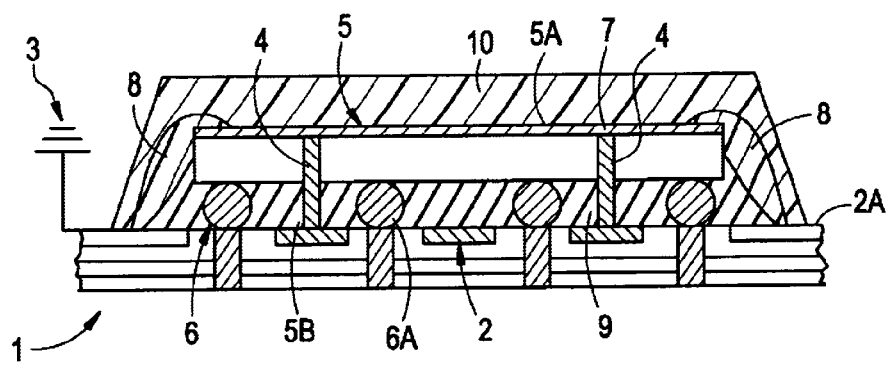
FIGS. 2a and 2b are cross-sections of the electronic element of FIG. 1.
Figure 2B:
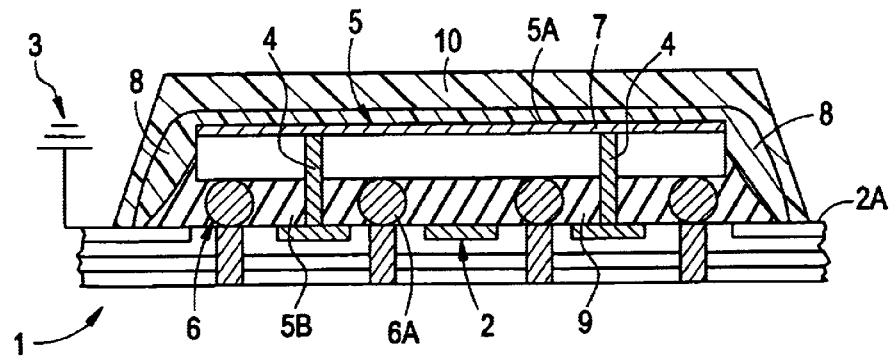

The electronic element shown in FIGS. 1 and 2a and 2b comprises a carrier 1 having at least an electrically conductive mass plane 2 consisting of a layer 2A connected to a mass 3.

The carrier 1 is advantageously of the type comprising, in addition to the mass plane 2, several conductive layers or intermediate layers for the various connections to be carried out.

A flipped chip die 5 is mounted on said carrier 1 with interposition of a bump layer 6 for the mechanical and electrical connection of the die 5 with the carrier 1.

Said flipped chip die has a backside 5A opposite to a front side 5B directed towards the carrier, said backside 5A being covered with a top electrically conductive layer 7.

Said layer 7 covers preferably the complete backside 5A and is for example a metallic layer or layer containing conductive material, such as gold, silver, carbon black, fibers, sheet, filaments, lattices, etc., possibly mixed in a resin layer.

An electrically conductive connection means 8 forms an electrical connection between the layer 7 and the electrically conductive mass plane 2 of the carrier 1.

In the embodiment shown in FIGS. 1 and 2a, the conductive connection means 8 is a conductive glue which adheres, on the one hand, to all sides edges of the layer 7 and, on the other hand, to the layer 2A connected to the mass 3.

An under-fill 9 made of not conductive material is placed between the bumps 6A of the bump layer 6 which is used for mechanical contact.

A mold component 10 in insulating material, for example in plastic, covers the layer 7 and the connection means 8 for protection.

A faraday cage is thus built around the die 5 by the conductive layer 7 covering the backside 5A of the die 5, the conductive connection means 8 and the mass plane 2 or the layer 2A of the carrier 1 connected to the mass 3.

As shown in FIG. 2b, the conductive glue covers the layer 7 completely and forms therefore a further protection for the die 5.

Figure 3A:
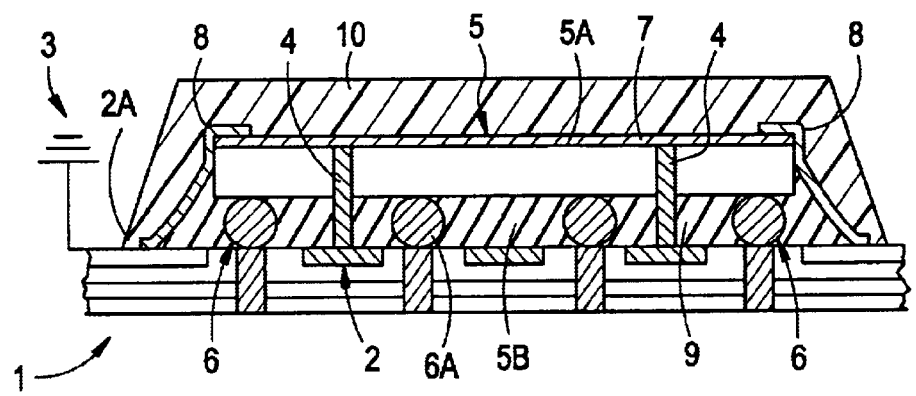
FIGS. 3a and 3b are cross-sections similar to FIGS. 2a and 2b, but pertaining to other embodiments of the invention.
Figure 3B:
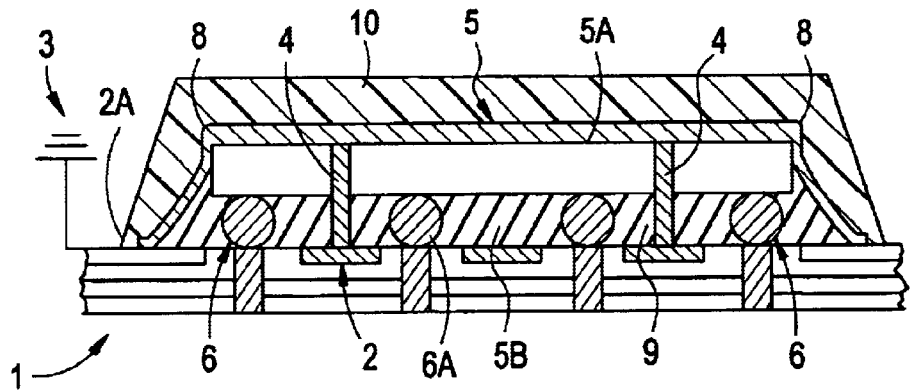

As shown in FIG. 3b, the layer 7 is also formed by the same conductive glue as the connection means 8 and in one piece with these means.

The connection means 8 may be a conductive tape instead of a conductive glue.

FIG. 3a shows such embodiment wherein a conductive tape, forming the connection means 8, is applied on the side edges of the layer 7.

In alternative embodiments, the tape covers also the layer 7 or the layer 7 is a portion of the tape which covers also the backside 5A of the die 5.

In another alternative embodiment, the connection means 8 may comprise a conductive connection extending through the silicon material of the die 5.

This connection 4 connects the conductive layer 7 covering the backside 5A to bond pads at the side of the die 5 that is connected to the electrically conductive portion 2 of the carrier 1.

This connection 4 may be incorporated during the manufacturing of the die 5.

In all forms of embodiment, the electronic element of the invention can be manufactured easily and at a low cost, as no soldering or bonding wires are required.

The element of the invention finds many application in apparatuses where EMI (RF, EMC, etc.) have to be prevented, for example in apparatuses comprising emitting means, emitting antenna, etc., such as a Global System for Mobile Communications (GSM) apparatus and a Digital Enhanced Cordless Telephone (DECT) apparatus.

What is claimed is:

1. An electronic element comprising:
    a carrier having at least an electrically conductive mass plane;
    a flipped chip die mounted on the carrier, the said flipped chip die having a backside opposite to a front side directed towards the carrier; and
    an electromagnetic interference shield electrically connected to the conductive mass plane of the carrier,
    the electromagnetic interference shield comprising:
        an electrically conductive connection means, and
        an electrically conductive layer on the backside of the flipped chip die, wherein the electrically conductive connection means comprises a conductive connection through the flipped chip die, thereby connecting the electrically conductive layer to bond pads on the electrically conductive plane.

2. The electronic element according to claim 1, wherein the electrically conductive connection means electrically connects the conductive layer to the conductive mass plane of the carrier, so as to make a whole faraday cage around the flipped chip die.

3. The electronic element according to claim 2, wherein the electrically conductive connection means further comprises conductive glue.

4. Apparatus comprising an electronic circuit comprising at least an electronic element according to claim 3, and further to at least an antenna for emitting or receiving a radio frequency signal.

5. The electronic element according to claim 3, wherein the conductive glue covers the conductive layer.

6. The electronic element according to claim 2, wherein the conductive connection means further comprises conductive tape.

7. The electronic element according to claim 6, wherein the conductive tape covers the conductive layer.

8. The electronic element according to claim 1, wherein the connection means and the conductive layer are of the same material.

9. The electronic element according to claim 1, wherein the conductive layer covers completely the backside of the flipped chip die.

10. The electronic element according to claim 1, further comprising an insulating material that covers the electromagnetic interference shield.

* * * * *